(12) United States Patent  (10) Patent No.: US 7,751,519 B2
Farbarik et al.  (45) Date of Patent: Jul. 6, 2010

(54) PHASE ROTATOR FOR DELAY LOCKED LOOP BASED SERDES

(75) Inventors: Raymond J. Farbarik, Seattle, WA (US); Michael Steinberger, Chippewa Falls, WI (US)

(73) Assignee: Cray Inc., Seattle, WA (US)

( * ) Notice: Subject to any disclaimer, the term of this patent is extended or adjusted under 35 U.S.C. 154(b) by 644 days.

(21) Appl. No.: 11/748,368

(22) Filed: May 14, 2007

(65) Prior Publication Data

US 2008/0285598 A1    Nov. 20, 2008

(51) Int. Cl.
*H04L 7/00* (2006.01)
*H04L 25/00* (2006.01)
*H04L 25/40* (2006.01)

(52) U.S. Cl. .................. 375/371; 375/375; 375/376; 370/516

(58) Field of Classification Search ......... 375/371–376; 370/516
See application file for complete search history.

(56) References Cited

U.S. PATENT DOCUMENTS

2007/0160173 A1* 7/2007 Takeuchi ............... 375/355

* cited by examiner

*Primary Examiner*—Curtis B Odom
(74) *Attorney, Agent, or Firm*—Schwegman, Lundberg & Woessner, P.A.

(57) ABSTRACT

An apparatus comprising a first multiplexer circuit (MUX) to receive a plurality of clock phase signals at a corresponding plurality of MUX inputs and to output a first clock signal and a second clock signal that are out of phase with each other, a phase delay circuit to receive the output of the first MUX and to generate adjusted first and second clock signals that have reduced phase error with respect to detected edges of incoming data, an output MUX to receive the adjusted first and second clock signals and to output a recovered clock signal, and a control circuit coupled to output MUX select inputs. The control circuit includes logic circuitry to select the first adjusted clock signal as the recovered clock signal and to select the second adjusted clock signal as the recovered clock signal when the first adjusted clock signal nears a phase limit due to drift of the detected data edges. Other devices and methods are disclosed.

22 Claims, 8 Drawing Sheets

PHASE ROTATOR FOR DELAY LOCKED LOOP BASED SERDES

FEDERALLY SPONSORED RESEARCH OR DEVELOPMENT

The U.S. Government has a paid-up license in this invention and the right in limited circumstances to require the patent owner to license others on reasonable terms as provided for by the terms of Contact No. MDA904-02-3-0052, awarded by the Maryland Procurement Office.

TECHNICAL FIELD

The field generally relates to communication between electronic systems, and more particularly to communicating data between two points having different synchronizing clock sources in an electronic system.

BACKGROUND

Serializer/Deserializer (SerDes) circuits facilitate transmitting parallel data over a serial link between two points by converting parallel data into serial data for transmission and converting the received serial data to parallel data. This allows fewer physical interconnections to be necessary between the two points.

An electronic system is considered to be mesochronous if the two points share a common clock signal and thus share the same clock frequency. An electronic system is considered to be plesiochronous if the two communicating points use different sources for the synchronizing clock. A SerDes transceiver or link is typically a plesiochronous system. Because the two points do not share a common clock, a complication of using SerDes circuits is synchronizing data transmitted via a clock at the transmitting end with a clock generated by a different source at the receiving end. The frequencies of the two clocks may be slightly different and may vary over time. This is often referred to as frequency drift or frequency wander. Frequency drift makes it difficult to align received data with a local clock because the frequency of the clock at the transmitting side may drift with respect to the clock at the receiving side.

SUMMARY

This document discusses, among other things, devices and methods for communicating data between two points having different clock sources in an electronic system. A device example includes a first multiplexer circuit (MUX) to receive a plurality of clock phase signals at a corresponding plurality of MUX inputs and to output a first clock signal and a second clock signal that are out of phase with each other, a phase delay circuit to receive the output of the first MUX and to generate adjusted first and second clock signals that have reduced phase error with respect to a detected edges of incoming data, an output MUX to receive the adjusted first and second clock signals and to output a recovered clock signal, and a control circuit coupled to output MUX select inputs. The control circuit includes logic circuitry to select the first adjusted clock signal as the recovered clock signal and to select the second adjusted clock signal as the recovered clock signal when the first adjusted clock signal nears a phase limit due to drift of the detected data edges.

A method example includes selecting first and second clock signals from a plurality of clock phase signals where the first clock signal is selected as a recovered clock signal for a first integrated circuit (IC) and the second clock signal is out of phase with the first clock signal, phase adjusting the first clock signal to reduce a phase error between the first clock signal and detected edges of incoming data that are subject to phase drift relative to the first and second clock signals, detecting that the first clock signal is nearing a phase limit due to drift of the detected data edges, and phase adjusting the second clock signal to reduce a phase error between the second clock signal and the detected data edges and selecting the second clock signal as the recovered clock signal for the first IC.

This summary is intended to provide an overview of the subject matter of the present patent application. It is not intended to provide an exclusive or exhaustive explanation of the invention. The detailed description is included to provide further information about the subject matter of the present patent application.

DETAILED DESCRIPTION

In the following detailed description, reference is made to the accompanying drawings which form a part hereof, and specific embodiments in which the invention may be practiced are shown by way of illustration. It is to be understood that other embodiments may be used and structural or logical changes may be made without departing from the scope of the present invention.

As described above, a complication of using SerDes circuits is synchronizing a clock used to clock data at the transmitting end with a clock at the receiving end. The transmitting clock is often recovered at the receiving end from the data stream using clock data recovery (CDR) techniques. With CDR, the receive SerDes circuitry synchronizes the incoming data with a local version of a transmitting clock received at the receiving end. In one embodiment, the receive SerDes circuit recovers the transmitting clock from the received data stream.

One approach in CDR is to align the synchronizing clocks with a phase lock loop (PLL). In a PLL a phase detector detects a phase difference between incoming received data and the synchronizing clock on the receiving end. The phase detector generates a voltage proportional to the phase difference and feeds the voltage to a voltage controller oscillator (VCO). The VCO modifies the ring frequency of the synchronizing clock according to the voltage to track the incoming data. However, PLL-based circuits have the danger of locking onto a harmonic of neighboring PLLs or any other signal whose frequency is very near the VCO frequency. This problem is often referred to as injection locking and may limit the number of SerDes circuits that can be included on a single integrated circuit chip. Delay Lock Loops (DLLs) avoid injection locking because they do not use a VCO.

Figure 1:
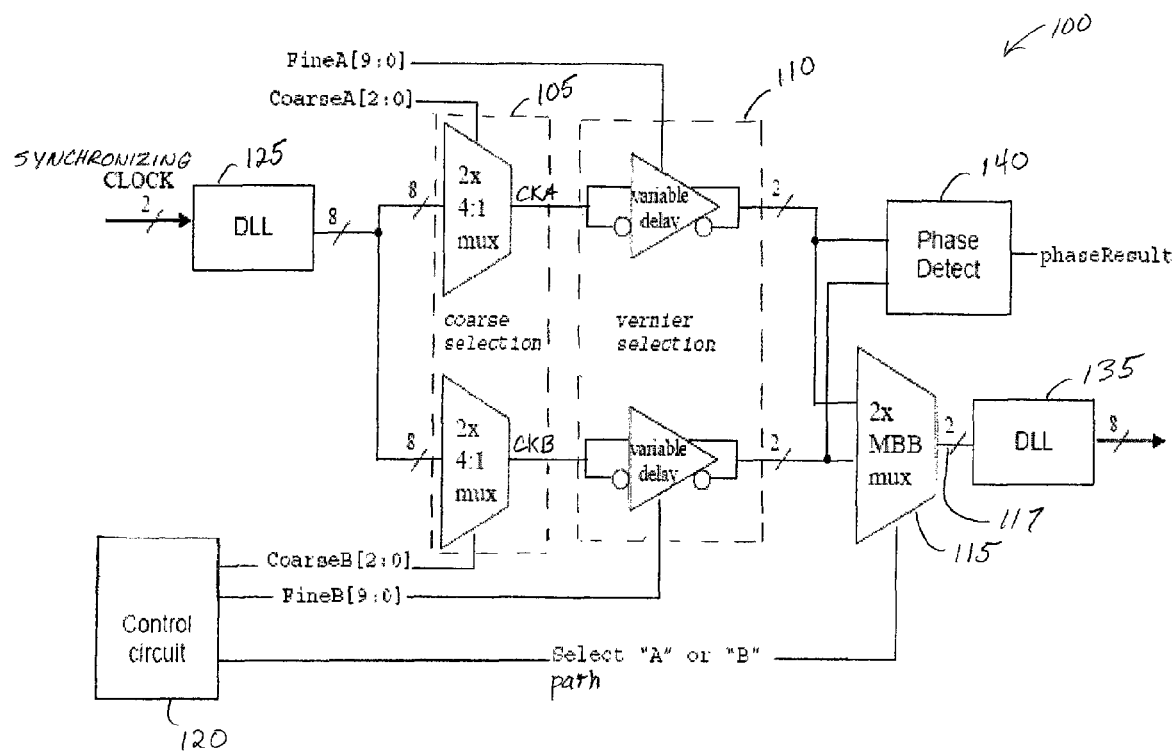
FIG. 1 is a block diagram of an example of portions of a clock data recovery (CDR) circuit.

FIG. 1 is a block diagram of an example of portions of a clock data recovery (CDR) circuit 100. The CDR circuit 100 is included in a receive side of a SerDes transmit/receive pair. The SerDes transmit/receive pair may be included in a SerDes link between integrated circuit (ICs) on the same printed circuit board (PCB) or between ICs on different PCBs connected by a communication cable.

The CDR circuit 100 includes a first multiplexer (MUX) circuit 105, a phase delay circuit 110, an output MUX 115, and a control circuit 120. The first MUX circuit 105 receives a plurality of clock phase signals at its inputs, and outputs two clocks CKA and CKB which are out of phase with respect to each other. The plurality of input clock phase signals are generated from a reference clock signal by a first DLL 125. In some embodiments, the reference clock signal is the synchronizing clock signal at the receiving side of a SerDes link. The reference clock signal may be a differential clock signal. The first DLL 125 generates the clock phase signals using signal delay circuits.

Figure 2:
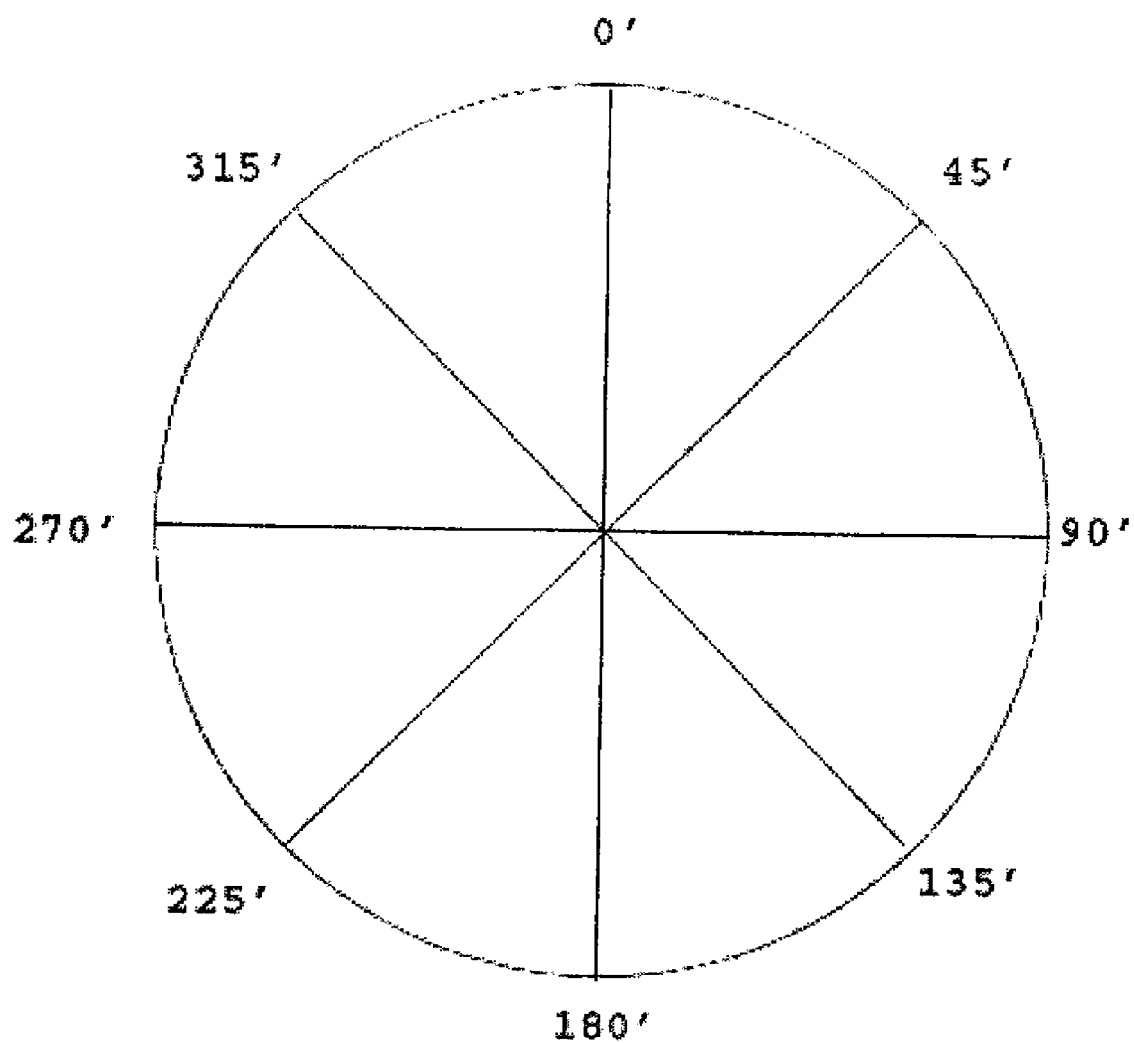
FIG. 2 shows an example of spacing of clock phase signals.

In some embodiments, eight clock phase signals are generated having phase offsets that are evenly spaced over 360 degrees (360°) and are input to the first MUX circuit 105. FIG. 2 shows an example of spacing of clock phase signals. The clock signals are spaced 45° out of phase with each other and include phase delays of 0°, 45°, 90°, 135°, 180°, 225°, 270°, and 315° from the reference or synchronizing clock. The first MUX circuit 105 outputs a first clock signal (CKA) and a second clock signal (CKB) according to MUX select inputs (COARSE A[2:0], COARSE B[2:0]) selected by the control circuit 120. In this way, two clock paths are generated. In some embodiments, CKA and CKB are selected to be 45° out of phase with each other.

The phase delay circuit 110 receives the first and second clocks from the first MUX and generates adjusted first and second clock signals (adjusted CKA and adjusted CKB). The control circuit 120 adjusts the clock signals (using FINEA[9:0] and FINEB[9:0]) to have reduced phase error with respect to detected edges of the incoming data. The detected data edges are used as a representation of the clock on the transmitting side of the SerDes. Because the CDR circuit 100 is plesiochronous, the transitions of the external clock on the transmitting side are derived from the detected data edges. In some embodiments, an edge detection circuit is used to sense or detect edges of transitions on the incoming serial data.

The adjusted clock signals (adjusted CKA and CKB) are compared to the detected data edges and the phase delay circuit 110 is adjusted to minimize the phase error. The output MUX 115 receives the adjusted first and second clock signals and outputs a recovered clock signal 117. Selecting the CKA and CKB from the plurality of clock phase signals can be viewed as a coarse adjustment in tracking the detected data edges.

The phase delay circuit 110 provides sufficient adjustable delay to cover the phase difference between CKA and CKB. This can be viewed as a fine or a vernier adjustment in tracking the detected data edges. For example, if CKA and CKB are 45o out of phase, the phase delay circuit 110 provides 45° of phase delay to CKA and CKB to allow each signal to be delayed to a phase limit where it crosses over into the phase of the other clock signal. If eight clock signals evenly spaced over 360° are used, the phase delay circuit 110 provides a clock sweep over a 45° octant. The control circuit 120 is coupled to select inputs of the output MUX 115. The control circuit 120 includes logic circuitry to select the first adjusted clock signal as the recovered clock signal 117 and to select the second adjusted clock signal as the recovered clock signal 117 when the first adjusted clock signal nears a phase limit due to drift of the detected data edges.

For example, assume that the CKA is chosen to have 0° phase delay from the detected data edges, CKB is chosen to have 45° of phase delay from the detected data edges, and adjusted CKA is chosen to be the recovered clock signal 117. If the detected data edges and the synchronizing clock are in sync, then no phase delay adjustment of CKA is needed. If the detected data edges drift, the control circuit 120 adjusts the phase delay of CKA to drift with the detected data edges. If the detected data edges drift 45°, they fall out of range of the CKA adjustment (i.e., it reaches the phase limit of adjusted CKA) and CKB should be used to track the detected data edges. When this happens, the control circuit 120 selects adjusted CKB as the recovered clock signal 117. If the detected data edges continue to drift, the control circuit 120 adjusts the phase delay of CKB.

It can be seen in the example, that the two clock paths each supply clock variance to cover 45° of phase drift. When a clock path reaches the limit of the 45° octant, the other path is selected to supply the clock. Thus, the control circuit 120 can coordinate a full 360° of rotation for the recovered clock signal 117 by alternating between the two clocks using a hand-over-hand method.

If the control circuit 120 selects the first clock signal (CKA) to have 90° phase offset and the detected data edges are drifting toward the 135° upper phase limit boundary, the control circuit 120 may choose the second clock signal (CKB) to lag the first clock signal (CKA) using the COARSE inputs to the first MUX circuit 105. The CKB signal can then be used to track the detected data edges at phase offsets of 135° to 179°. Conversely, if the detected data edges are drifting toward the 90° lower phase limit boundary, the control circuit 120 may choose the second clock signal (CKB) to lead the first clock signal (CKA). The CKB signal can then be used to track the detected data edges at phase offsets of 45° to 89°. In some embodiments, the control circuit 120 detects that either the adjusted CKA or adjusted CKB is approaching a lower phase limit boundary when the FINE adjust approaches a low count boundary (e.g., FINEA=0) and detects that adjusted CKA or adjusted CKB is approaching a high phase limit boundary when the FINE adjust approaches a high count boundary (e.g., FINEA=$2^{10}$). It is to be noted that a count boundary is dependent on the circuit implementation. The circuit implementation is highly dependent on various factors such as the data rate, the manufacturing process, the voltage used in the circuit, and the temperature the circuit is expected to be exposed to.

Figure 3:
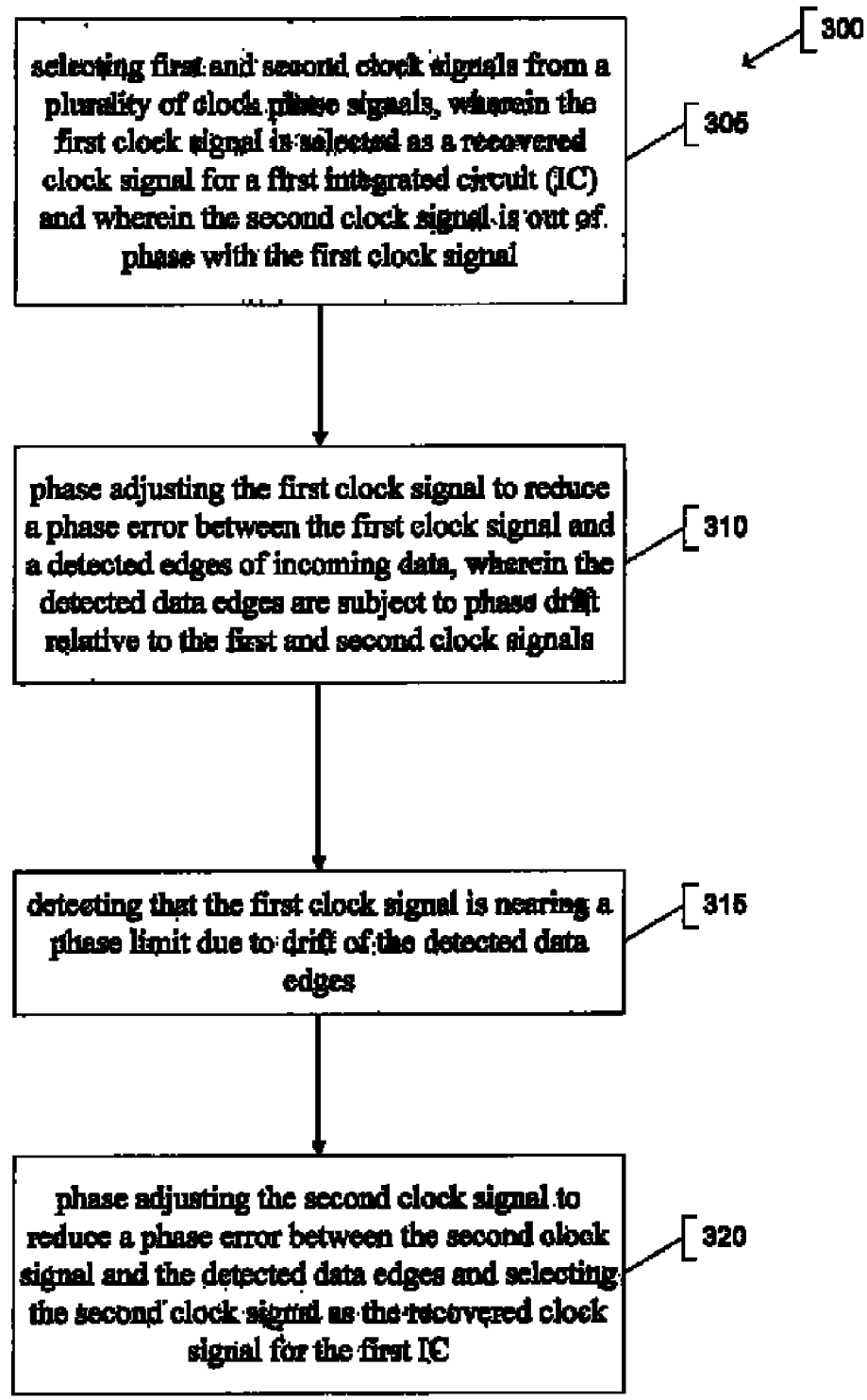
FIG. 3 is a flow diagram of an embodiment of a method of synchronizing clocks in a plesiochronous system.

FIG. 3 is a flow diagram of an embodiment of a method 300 of synchronizing clocks in a plesiochronous system. At block 305, first and second clock signals are selected from a plurality of clock phase signals. The first clock signal is selected as a recovered clock signal for a first integrated circuit (IC) and the second clock signal is out of phase with the first clock signal. At block 310, the first clock signal is phase adjusted to reduce a phase error between the first clock signal and detected edges of incoming data. Because the system is plesiochronous, the detected data edges are subject to phase drift relative to the first and second clock signals.

At block 315, it is detected that the first clock signal is nearing a phase limit or phase limit boundary due to drift of the detected data edges. At block 320, the second clock signal is phase adjusted to reduce a phase error between the second clock signal and the detected data edges and the second clock signal is selected as the recovered clock signal for the first IC.

Figure 4:
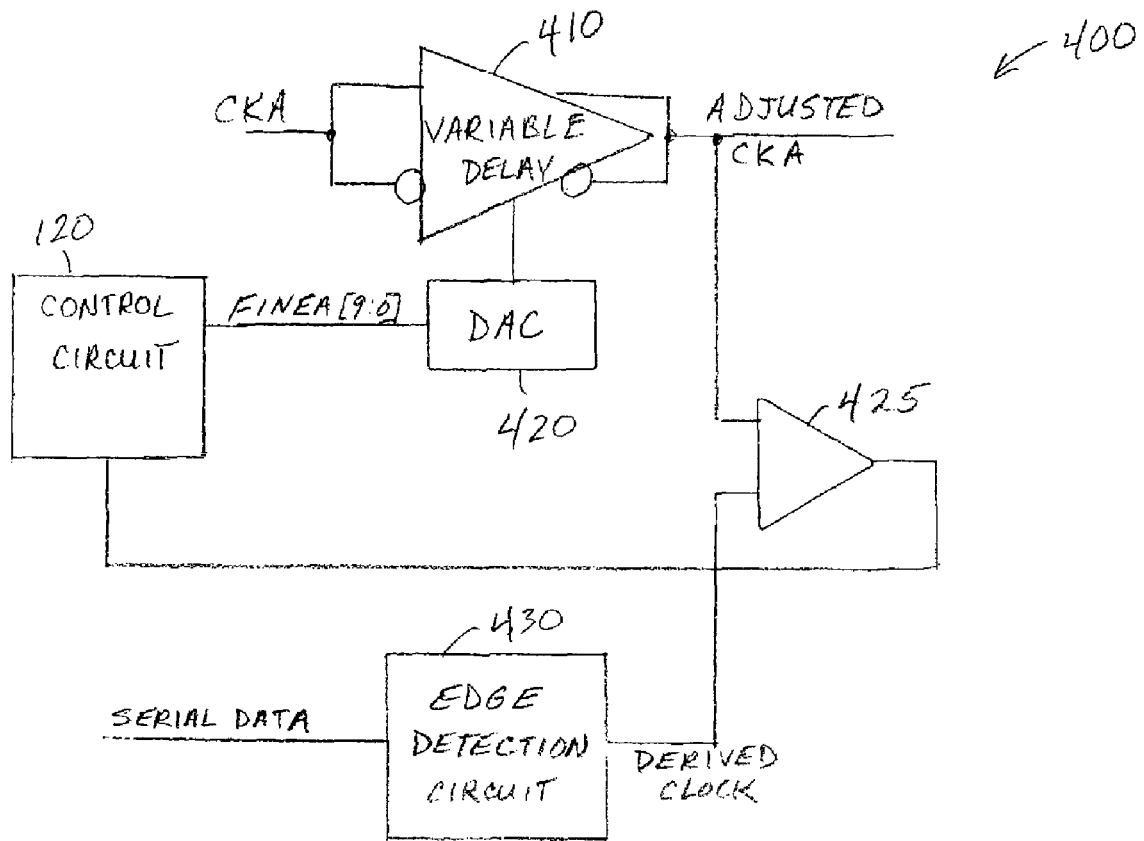
FIG. 4 is a block diagram of an example of a circuit to adjust the clock signals.

FIG. 4 is a block diagram of an example of a circuit 400 to adjust the clock signals (CKA and CKB). The circuit 400 includes a digital to analog converter (DAC) 420, a variable delay circuit 410, and a phase comparison circuit 425. The DAC 420 independently adjusts the delay of the first and second clock signals (CKA and CKB) between a lower phase limit boundary and an upper phase limit boundary using a variable delay circuit. The connection to the variable delay circuit for CKB is not shown to simplify the diagram. The phase comparison circuit 425 compares a phase of at least one of the first and second clock signals to a phase of the detected data edges and outputs a signal according to the comparison. An edge detection circuit 430 monitors the serial data input and detects the edges of transitions of the incoming serial data. The control circuit 120 is coupled to DAC inputs and the phase comparison circuit 425. The control circuit includes logic circuitry to receive the signal from the phase comparison circuit 425 and increment or decrement the DAC input according to the phase comparison circuit output signal to adjust the delay of the first and second clock signals.

The DAC 420 provides digital control for the independently adjustable delay for the CKA path and the CKB path. The adjustable delay is generated using a delay chain for each path. The DAC inputs change a current or voltage at the DAC output which is connected to a delay chain. Changing the current or voltage adjusts the delay through a series of delay stages in the delay chain. In some embodiments, the adjustable delay is provided to cover a fine or vernier delay range that spans the 45° between the coarse settings.

Figure 5:
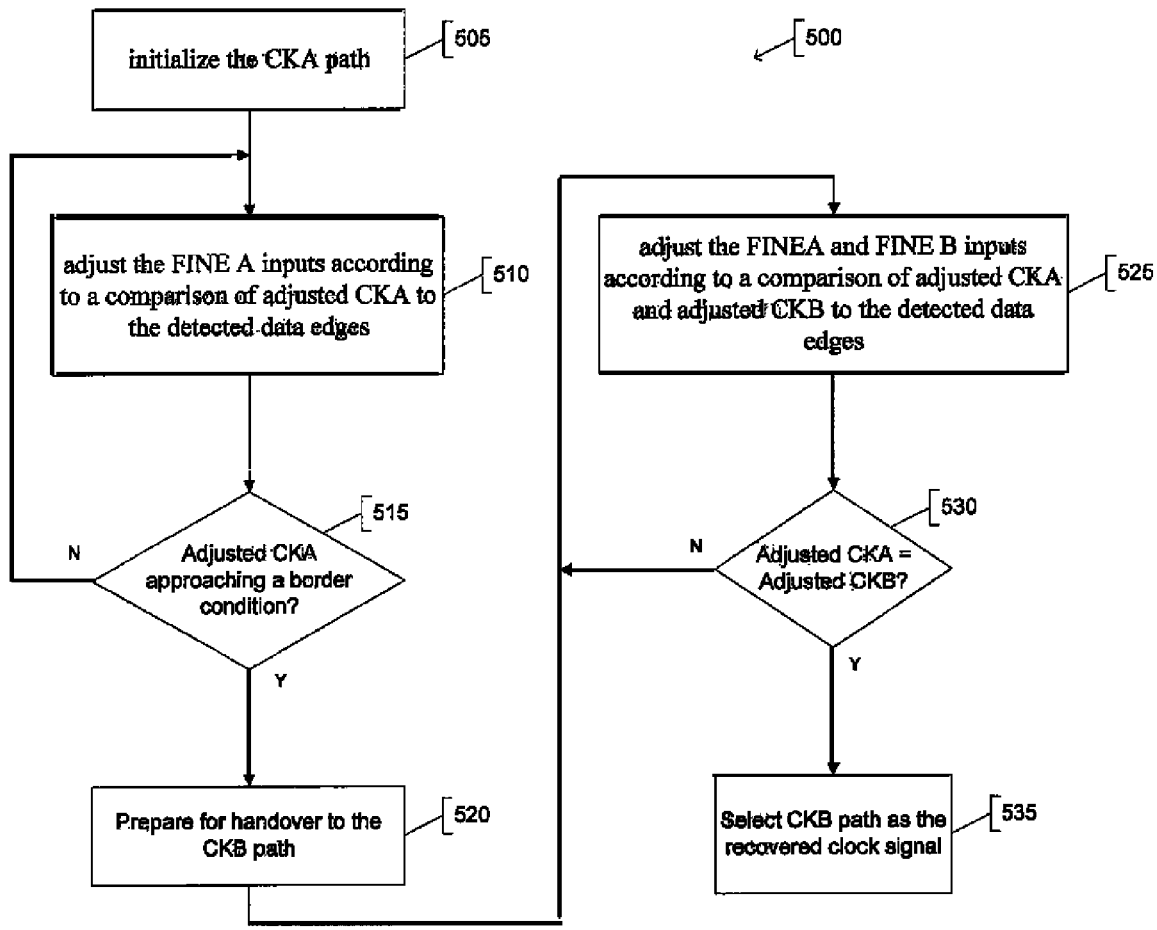
FIG. 5 is a flow diagram of another method of synchronizing clocks in a plesiochronous system.

FIG. 5 is a flow diagram of another method 500 of synchronizing clocks in a plesiochronous system. The method describes the operation of the circuit of FIG. 1. At block 505, the control circuit 120 initializes the CKA path. The COARSE A inputs to the first MUX 105 are initialized to an arbitrary number (e.g., a number from 0 through 7) and the FINE A inputs to the phase delay circuit 110 are initialized to an arbitrary number (e.g., a number from 0 to $2^{10}$). The CKA path is initialized as the recovered clock signal 117 using the select input on the output MUX 115. At block 510, the control circuit 120 adjusts the FINEA inputs according to a comparison of adjusted CKA to the detected data edges, such as by the circuit 400 of FIG. 4 for example.

At block 515, the control circuit 120 determines whether adjusted CKA is approaching a border condition (e.g., either a high phase boundary limit or a low phase boundary limit). If CKA is not approaching a border condition, flow continues to adjust FINE A at block 510. If CKA is approaching a border condition, flows continues to block 520 where the control circuit 120 prepares for a handover to the CKB path. To prepare for the handover, if FINEA is approaching the high count boundary, COARSEB is initialized to COARSEA+1, and FINEB=0. Setting COARSEB=COARSEA+1 results in CKB having a phase offset from the octant that lags the phase offset octant for CKA. If FINEA is approaching the low count boundary, COARSEB is initialized to COARSEA−1, and FINEB=$2^{10}$−1. Setting COARSEB=COARSEA−1 results in CKB having a phase offset from the octant that leads the phase offset octant for CKA.

At block 525, the control circuit 120 adjusts the FINEA and FINEB inputs according to a comparison of adjusted CKA and adjusted CKB to the detected data edges. At block 530, it is determined whether adjusted CKA=adjusted CKB. In some embodiments, a phase detect circuit 140 in FIG. 1 determines whether adjusted CKA=adjusted CKB. If they are not equal the adjustment continues. If adjusted CKA=adjusted CKB, then the CKB path is selected as the recovered clock signal 117. The method 500 then continues adjusting CKB or adjusting both CKA and CKB when adjusted CKB approaches a border condition. If CKB then approaches a high or low phase boundary, COARSEA is initialized similar to COARSEB as set forth above. If adjusted CKB=adjusted CKA, then the CKA path is selected as the recovered clock signal 117. Thus, the handing-off of clock paths goes back forth between the CKA path and the CKB path.

Returning to FIG. 1, in some embodiments, the output MUX 115 of the CDR circuit 100 includes a make-before-break (MBB) logic circuit to facilitate the hand over from one clock signal path to the other. When a handoff is made from the CKA path to the CKB path (or vice versa), the adjusted CKA and adjusted CKB are aligned and are nearly identical. The MBB logic circuit minimizes the occurrence of glitches on the recovered clock signal 117. It may be a circuit fault for the two paths to be slightly off at the time of the handoff because it could result in two extra edges (one rising and one falling) being passed through the circuit. Such a glitch may occur if one clock path is transitioning slightly at a different moment than the other.

Figure 6:
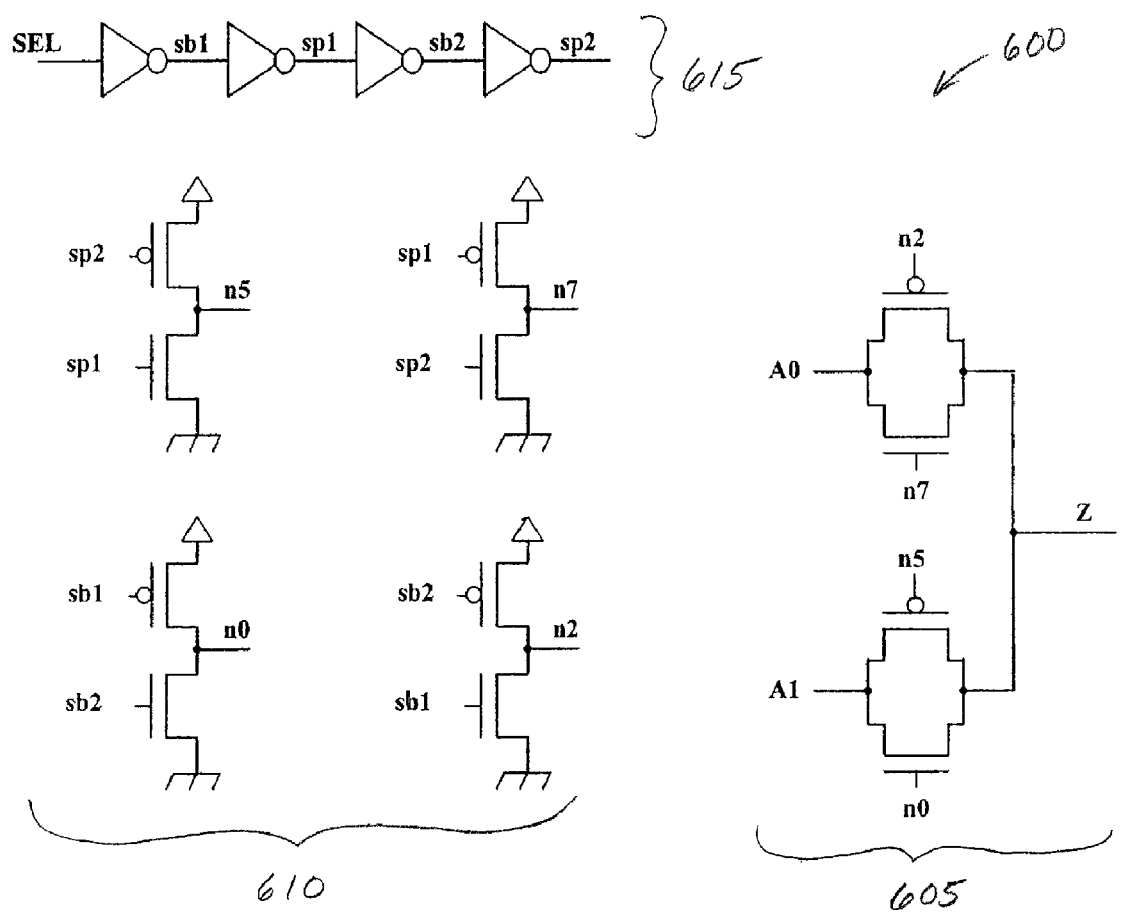
FIG. 6 is an example of a make-before-break logic circuit.

FIG. 6 is an example of an MBB logic circuit 600 for the output MUX 115. The circuit includes a pass gate multiplexer 605 with inputs A1, A0 and output Z. Circuit 610 generates the control signals for the pass gate multiplexer 605. Delay circuit 615 generates signals used to create the control signals. Circuit 610 and delay circuit 615 minimize glitches at the moment of handoff by allowing only one rising edge or one falling edge to occur at any one time during the handoff.

Returning to FIG. 1, in some embodiments, the CDR circuit 100 includes a second DLL 135. The second DLL 135 receives the recovered clock signal 117 and outputs a plurality of clock phase signals having have equally spaced phase offsets as does the output from the first DLL 125. However, because the recovered clock is synchronized to the detected data edges, the generated clock phase signals are also synchronized to the detected data edges. Thus, the plurality of clock phase signals from the second DLL 135 can be used to clock incoming data.

Figure 7:
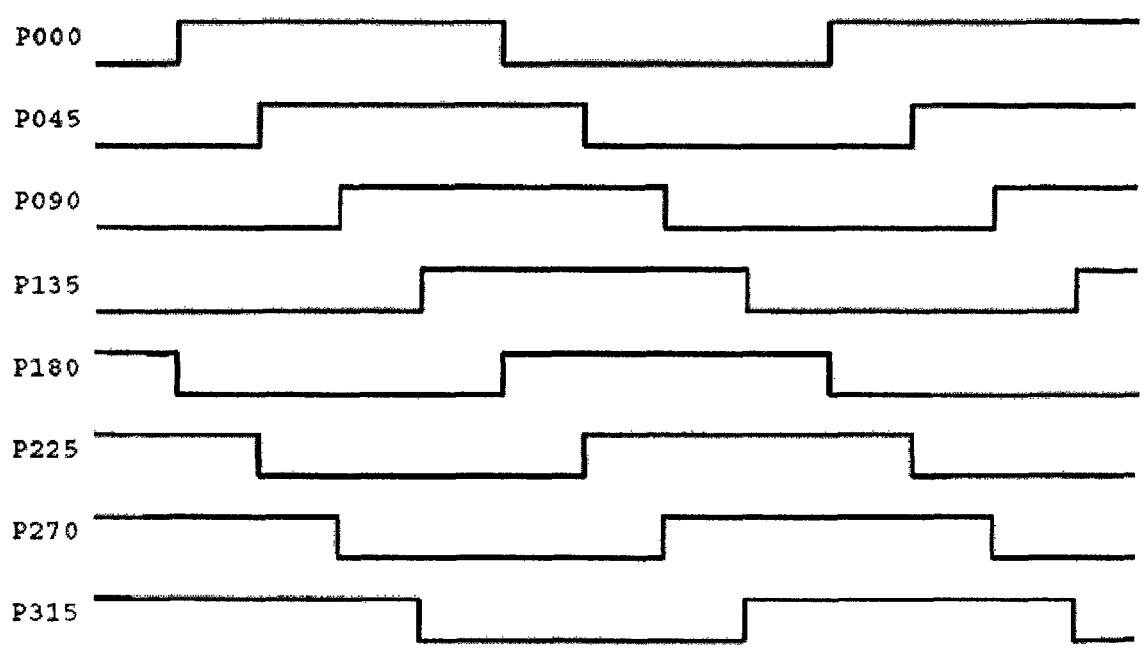
FIG. 7 shows an example of clock phase signals.

FIG. 7 shows an example of clock phase signals generated by the second DLL 135. The example shows eight clock phase signals where each clock signal is 45° out of phase with its adjacent clock phase signal. An edge (e.g., the rising edge) of the clock signals can be used to clock the serial data received over the SerDes link into latches to convert the serial data back into parallel data.

Figure 8:
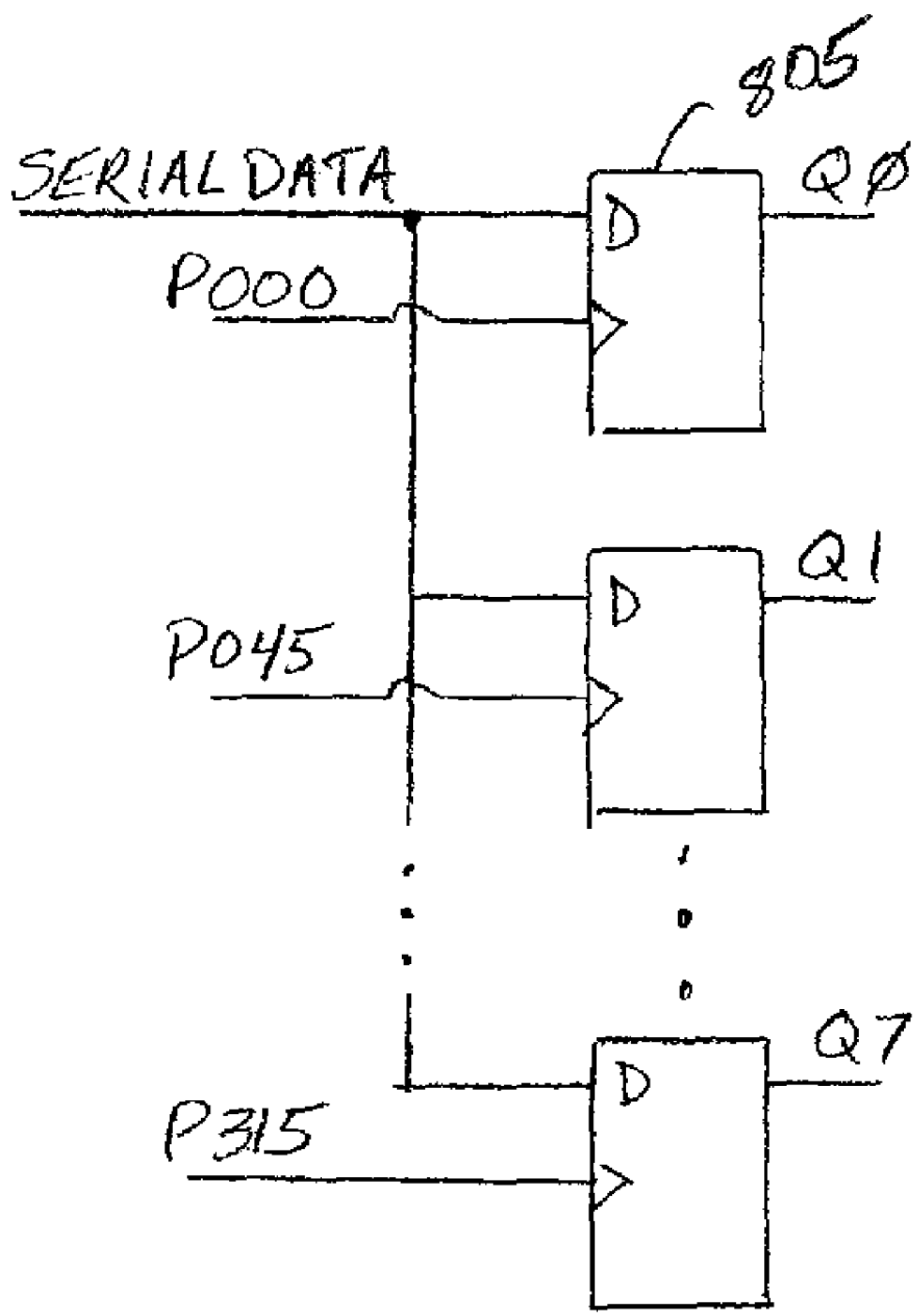
FIG. 8 shows an example of using clock phase signals to clock serial data.

FIG. 8 shows an example of using the clock phase signals to clock the serial data. The clock phase signals are communicatively coupled to clock inputs of data latches 805 and serial data is received at the data input of the latches 805. This allows the clock phase signals to sequentially latch data received on the serial data input into the data latches 805 and build the received serial data into data registers. If eight clock phase signals and eight data registers are used, each of eight serial data bits is sequentially stored by one of the eight registers. This reduces the chance that a data bit will be missed.

In some embodiments, the serial data is received into a plurality of data registers. The clock phase signals generated by the second DLL 135 of FIG. 1 are used to capture data being transmit during a certain, specific time span (sometimes called a symbol). It is to be noted that the frequency of the recovered clock is a fraction of the rate at which data is received. In the example, the recovered clock is running at one-eighth the frequency of the data rate. The time delay between edges of the clocks of FIG. 7 is about equal to the duration of a single bit time. Each successive data bit is latched by a different one of the clocks of FIG. 7 and each clock signal is used to sample one of eight bits. Thus, the clock signals in FIG. 7 are used to capture eight bits transmit during a symbol.

A complication of latching the serial data into registers is to provide proper data-byte alignment on register boundaries to match the incoming data. In some embodiments, the control circuit 120 changes the select bits of the first MUX 105 (COARSEA and COARSEB) to re-align incoming serial data to a register boundary. For example, decrementing both of the COARSEA and COARSEB select bits skips the output by one entire symbol and aligns the data onto a different set of registers.

It can be seen that the second DLL 135 takes the frequency tracked clock output from the output MUX 115 and multiplies the tracked clock to generate clock signals to latch the incoming serial data. Thus, the CDR circuit 100 does not use a PLL and is safe from the injection locking problem. Therefore, many instances of a SerDes link can be included on a single chip. Additionally, each CDR circuit on such a chip may operate at different frequencies and harmonics from other CDR circuits.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations, or variations, or combinations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own.

What is claimed is:

1. A clock data recovery (CDR) circuit comprising:
a first multiplexer circuit (MUX) to receive a plurality of clock phase signals at a corresponding plurality of MUX inputs and to output a first clock signal and a second clock signal that are out of phase with each other;
a phase delay circuit to receive the output of the first MUX and to generate adjusted first and second clock signals, wherein the adjusted first and second clock signals have reduced phase error with respect to detected edges of incoming data;
an output MUX to receive the adjusted first and second clock signals and to output a recovered clock signal; and
a control circuit coupled to output MUX select inputs, wherein the control circuit includes logic circuitry to select the first adjusted clock signal as the recovered clock signal and to select the second adjusted clock signal as the recovered clock signal when the first adjusted clock signal nears a phase limit due to drift of the detected data edges.

2. The CDR of claim 1, wherein the phase delay circuit includes:
a digital to analog converter (DAC) to independently adjust a delay of the first and second clock signals between a lower phase limit boundary and an upper phase limit boundary; and
a phase comparison circuit to compare a phase of at least one of the first and second clock signals to a phase of the detected data edges and to output a signal according to the comparison,
wherein the control circuit is coupled to DAC inputs and the phase comparison circuit, and wherein the logic circuitry increments or decrements the DAC input according to the phase comparison circuit output signal to adjust the delay of the first and second clock signals.

3. The CDR of claim 1, including:
a first delay locked loop (DLL) circuit to generate the plurality of clock phase signals from a reference clock signal, wherein the plurality of clock phase signals have equally spaced phase offsets,
wherein the control circuit is coupled to first MUX select inputs, and wherein the control circuit is to select the second clock signal having phase offset lagging the first clock signal when the first clock signal nears an upper phase limit boundary, and to select the second clock signal having phase offset leading the first clock phase signal when the first clock signal nears a lower phase limit boundary.

4. The CDR of claim 3, including a second DLL circuit to receive the recovered clock and output a second plurality of clock phase signals synchronized to the detected data edges, wherein the second plurality of clock phase signals have equally spaced phase offsets.

5. The CDR of claim 4, including an edge detection circuit that monitors transitions of a serial data input to detect edges of the transitions of incoming serial data.

6. The CDR of claim 5, wherein the second plurality of clock phase signals are communicatively coupled to clock inputs of a plurality of data latches to sequentially latch data received on the serial input into the plurality of data latches.

7. The CDR of claim 6, wherein the plurality of data latches are included in a plurality of registers, and wherein the control circuit changes the first MUX select bits to re-align incoming serial data to a register boundary.

8. The CDR of claim 3, wherein the first DLL generates eight clock phase signals having phase offsets evenly spaced over 360 degrees of phase.

9. The CDR of claim 1, wherein the output MUX includes a make-before-break logic circuit.

10. A method comprising:
selecting first and second clock signals from a plurality of clock phase signals, wherein the first clock signal is selected as a recovered clock signal for a first integrated circuit (IC) and wherein the second clock signal is out of phase with the first clock signal;
phase adjusting the first clock signal to reduce a phase error between the first clock signal and detected edges of incoming data, wherein the detected data edges are subject to phase drift relative to the first and second clock signals;
detecting that the first clock signal is nearing a phase limit due to drift of the detected data edges; and
phase adjusting the second clock signal to reduce a phase error between the second clock signal and the detected data edges and selecting the second clock signal as the recovered clock signal for the first IC.

11. The method of claim 10, including:
generating the plurality of clock phase signals from a reference clock signal using a first delay locked loop (DLL); and
applying a selected recovered clock signal to a second DLL to generate a second plurality of clock phase signals synchronized to the detected data edges, wherein each signal of the second plurality of clock phase signals is out of phase with the other clock phase signals of the second plurality of clock phase signals.

12. The method of claim 11, including latching data received at the first IC on a clock edge of each of the second plurality of clock phase signals.

13. The method of claim 11, including:
sequentially latching data received at the first IC into latches of registers on a clock edge of each of the second plurality of clock phase signals; and
selecting a different clock phase signal for the first clock signal and a different clock phase signal for the second phase signal to align incoming serial data to a register boundary.

14. The method of claim 10, including:
adjusting the first clock signal using a fine adjustment between a lower phase limit boundary and an upper phase limit boundary; and
adjusting the second clock signal to phase lead the first clock signal when the first clock signal reaches the lower phase limit boundary and to phase lag the first clock signal when the first clock signal reaches the upper phase limit boundary.

15. The method of claim 14, wherein adjusting the first clock signal includes incrementing and decrementing an input to a digital to analog converter (DAC) to adjust the first clock signal between the lower phase limit boundary and the upper phase limit boundary, and wherein the output of the DAC adjusts a delay of the first clock signal.

16. The method of claim 15, including:
detecting that the second clock signal is reaching a phase limit due to drift of the detected data edges;
selecting a different clock phase signal from the plurality of clock phase signals for the first clock signal; and
adjusting the first clock signal to reduce a phase error between the first clock signal and the detected data edges and selecting the first clock signal as the recovered clock signal for the first IC.

17. The method of claim 10, wherein a representation of timing of an external clock signal of a second IC is determined using serial data received from the second IC.

18. A serializer/deserializer (SerDes) circuit on a first integrated circuit (IC), wherein the SerDes circuit includes:
a serial data input to receive data from a second IC;
an edge detection circuit, coupled to the serial data input, to monitor transitions of the serial data input and to detect edges of incoming data; and
a CDR circuit including:
a first multiplexer circuit (MUX) to receive a plurality of clock phase signals at a corresponding plurality of MUX inputs and to output a first clock signal and a second clock signal that are out of phase with each other;
a phase delay circuit to receive the output of the first MUX output and to generate adjusted first and second clock signals having reduced phase error with respect to the detected data edges;
a second MUX to receive the adjusted first and second clock signals and output a recovered clock signal; and
a control circuit coupled to output MUX select inputs, wherein the control circuit includes logic circuitry to select the first adjusted clock signal as the recovered clock signal and to select the second adjusted clock signal as the recovered clock signal when the first adjusted clock signal nears a phase limit due to drift of the detected data edges.

19. The SerDes circuit of claim 18, including:
a first delay locked loop (DLL) circuit to generate the plurality of clock phase signals from a reference clock signal, wherein the plurality of clock phase signals have equally spaced phase offsets,
wherein the first MUX includes select inputs coupled to the control circuit, and
wherein the control circuit is to select a clock phase signal for the second clock signal that has phase offset lagging the first clock signal when the first clock signal nears an upper phase limit boundary, and to select a clock phase signal for the second clock signal that has phase offset leading the first clock phase signal when the first clock signal nears a lower phase limit boundary.

20. The SerDes circuit of claim 19, including:
a second DLL circuit to receive the recovered clock and output a second plurality of clock phase signals synchronized to the detected data edges, wherein the second plurality of clock phase signals have equally spaced phase offsets; and
a plurality of data latches, wherein each data latch includes a clock input to receive one of the second plurality of clock phase signals and a data input to receive data on a clock edge of each of the second plurality of clock phase signals.

21. The SerDes circuit of claim 18, wherein the phase delay circuit includes a digital to analog converter (DAC) to independently adjust the first and second clock signals between a lower phase limit boundary and an upper phase limit boundary.

22. The SerDes circuit of claim 21, wherein the phase delay circuit includes a phase comparison circuit to compare a phase of at least one of the first and second clock signals to a phase of the detected data edges and to output a signal according to the comparison, wherein the control circuit is coupled to DAC inputs and the phase comparison circuit, and wherein the logic circuitry increments or decrements the DAC input according to the phase comparison circuit output signal.

* * * * *